United States Patent
Feng

(10) Patent No.: US 12,219,787 B2
(45) Date of Patent: Feb. 4, 2025

(54) QLED DEVICES, HOLE TRANSPORT MATERIALS AND PRODUCING METHODS THEREOF, AND DISPLAY DEVICES

(71) Applicant: BOE Technology Group Co., Ltd., Beijing (CN)

(72) Inventor: Jingwen Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 183 days.

(21) Appl. No.: 17/426,615

(22) PCT Filed: Jan. 11, 2021

(86) PCT No.: PCT/CN2021/071135
§ 371 (c)(1),
(2) Date: Jul. 28, 2021

(87) PCT Pub. No.: WO2021/143653
PCT Pub. Date: Jul. 22, 2021

(65) Prior Publication Data
US 2022/0102664 A1 Mar. 31, 2022

(30) Foreign Application Priority Data
Jan. 16, 2020 (CN) .......................... 202010047324.6

(51) Int. Cl.
*H01L 51/50* (2006.01)
*C08K 3/22* (2006.01)
(Continued)

(52) U.S. Cl.
CPC ............... *H10K 50/15* (2023.02); *C08K 3/22* (2013.01); *C08K 3/30* (2013.01); *H10K 50/115* (2023.02);
(Continued)

(58) Field of Classification Search
CPC ...... H10K 50/15; H10K 50/115; H10K 50/16; H10K 50/17; H10K 71/00; H10K 85/10;
(Continued)

(56) References Cited

U.S. PATENT DOCUMENTS

| 2016/0351842 A1 | 12/2016 | Park et al. |
| 2017/0271605 A1 | 9/2017 | Steckel et al. |
| 2019/0115556 A1 | 4/2019 | Lee et al. |

FOREIGN PATENT DOCUMENTS

| CN | 106299159 A | * 1/2017 | ............. B82Y 30/00 |
| CN | 106784357 A | 5/2017 | |

(Continued)

OTHER PUBLICATIONS

CN202010047324.6 first office action.
PCT/CN2021/071135 international search report.

*Primary Examiner* — Ermias T Woldegeorgis
(74) *Attorney, Agent, or Firm* — IPro, PLLC

(57) ABSTRACT

The present invention provides QLED devices, hole transport materials and producing methods thereof, and display devices. A hole transport material includes a polymer, wherein the polymer is a single nanoparticle including at least a first metal compound and a second metal compound, the first metal compound and the second metal compound are linked via a covalent bond or a Van der Waals force, and valence band energy levels of the first metal compound and the second metal compound are different.

15 Claims, 4 Drawing Sheets

(51) Int. Cl.
*C08K 3/30* (2006.01)
*H10K 50/115* (2023.01)
*H10K 50/15* (2023.01)
*H10K 50/16* (2023.01)
*H10K 50/17* (2023.01)
*H10K 71/00* (2023.01)
*H10K 85/10* (2023.01)
*B82Y 20/00* (2011.01)
*H10K 102/00* (2023.01)

(52) U.S. Cl.
CPC ............. *H10K 50/16* (2023.02); *H10K 50/17* (2023.02); *H10K 71/00* (2023.02); *H10K 85/10* (2023.02); *B82Y 20/00* (2013.01); *C08K 2003/2248* (2013.01); *C08K 2003/2293* (2013.01); *C08K 2003/3009* (2013.01); *C08K 2201/001* (2013.01); *C08K 2201/011* (2013.01); *H10K 2102/351* (2023.02)

(58) Field of Classification Search
CPC ....... H10K 2102/351; H10K 2102/331; H10K 50/155; H10K 50/11; H10K 2101/40; C08K 3/22; C08K 3/30; C08K 2003/2248; C08K 2003/2293; C08K 2003/3009; C08K 2201/001; C08K 2201/011; C08K 2201/014; B82Y 20/00
See application file for complete search history.

(56) References Cited

FOREIGN PATENT DOCUMENTS

| | | | |
|---|---|---|---|
| CN | 105374953 | B | 1/2019 |
| CN | 109671853 | A | 4/2019 |
| CN | 109817510 | A | 5/2019 |
| CN | 109817840 | A | 5/2019 |
| CN | 110085757 | A | 8/2019 |
| CN | 110649167 | A * | 1/2020 |
| CN | 111341926 | A | 6/2020 |

* cited by examiner

QLED DEVICES, HOLE TRANSPORT MATERIALS AND PRODUCING METHODS THEREOF, AND DISPLAY DEVICES

CROSS-REFERENCE TO RELATED APPLICATIONS

This application is a US national phase of a PCT application under PCT/CN2021/071135 which is filed on Jan. 11, 2021, and claims the priority of the Chinese patent application under No. 202010047324.6 entitled "QLED DEVICES, HOLE TRANSPORT MATERIALS AND PRODUCING METHODS THEREOF, AND DISPLAY DEVICES" and filed on Jan. 16, 2020, the contents of which are incorporated herein by reference in its entirety.

TECHNICAL FIELD

The present invention relates to the field of display device technologies, and in particular, to QLED devices, hole transport materials and producing methods thereof, and display devices.

BACKGROUND

A QLED (Quantum dot light-emitting diode) display device is an electroluminescent device. Driven by an external electric field, electron holes and electrons overcome interface barriers to enter a valence band energy level and a conduction band energy level of a quantum dot light-emitting layer, respectively, and when returning from an excited state to a stable ground state, photons are released. With the development of quantum dot materials, continuous optimization of device structures and sustained in-depth research on efficient transportation of charges, etc., QLED displays will surpass photoluminescent quantum dot brightness enhancement films and quantum dot color filters, and are expected to become a next generation of mainstream display technology.

In a QLED device, each functional layer include a hole injection layer, a hole transport layer, a quantum dot light emitting layer, an electron transport layer, and electrodes. At present, most functional layers are made of organic materials. Because the organic materials are easily eroded by water and oxygen, which reduces lifetime of the device, development of inorganic functional layer materials has become a research hotspot. In the QLED device, introduction of the electron transport layer made of ZnO greatly improves electron injection efficiency, and hole injection needs to overcome large barriers, which causes electrons to become majority carriers in the device, makes an electron-hole injection imbalance, and affects efficiency and lifetime of the device.

SUMMARY

A first aspect of embodiments of the present invention provides a hole transport material, including: a polymer, wherein the polymer is a single nanoparticle including at least a first metal compound and a second metal compound, the first metal compound and the second metal compound are linked via a covalent bond or a Van der Waals force, and valence band energy levels of the first metal compound and the second metal compound are different.

It should be noted that the polymer in the present invention can be a dimer, a trimer, a tetramer, a pentamer or a hexamer, or be a single nanoparticle including more metal compounds. When the polymer is a dimer, the polymer is a single nanoparticle including a first metal compound and a second metal compound. The first metal compound and the second metal compound are linked via a covalent bond or a Van der Waals force, and valence band energy levels of the first metal compound and the second metal compound are different.

A second aspect of the embodiments of the present invention provides a method of producing a hole transport material, including: providing a precursor solution and a reaction solution respectively, wherein the precursor solution is used to provide at least a first metal source and a second metal source; adding the reaction solution into the precursor solution to obtain a composite compound of a first metal and a second metal after reaction; and heating the composite compound to obtain a polymer, wherein the polymer is a single nanoparticle including at least a first metal compound and a second metal compound, the first metal compound and the second metal compound are linked via a covalent bond or a Van der Waals force, and valence band energy levels of the first metal compound and the second metal compound are different.

A third aspect of the embodiments of the present invention provides a QLED device, including: a hole transport layer formed of the hole transport material as described above.

A fourth aspect of the embodiments of the present invention provides a method of producing a QLED device, including: forming a hole injection layer on a first electrode; forming a hole transport layer on a side of the hole injection layer away from the first electrode, wherein the hole transport layer includes a hole transport material produced through the producing method as described above; forming a quantum dot layer on a side of the hole transport layer away from the hole injection layer; forming an electron transport layer on a side of the quantum dot layer away from the hole transport layer; and forming a second electrode on a side of the electron transport layer away from the quantum dot layer.

A fifth aspect of the embodiments of the present invention provides a display device, including: the QLED device as described above.

It should be understood that the above general description and the following detailed description are only exemplary and explanatory and are not restrictive of the present invention.

BRIEF DESCRIPTION OF THE DRAWINGS

The accompanying drawings, which are incorporated in and constitute a part of this specification, illustrate examples consistent with the present disclosure and, together with the description, serve to explain the principles of the present invention.

A LIST OF REFERENCE SIGNS

Figure 1:
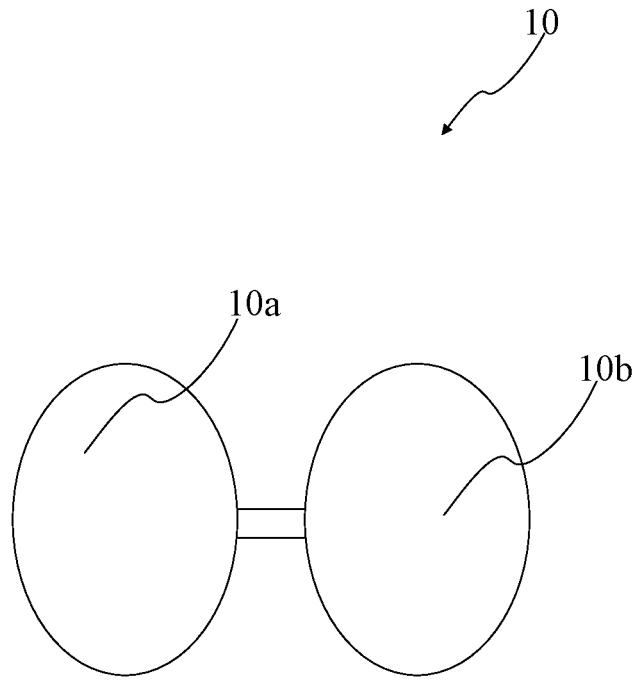
FIG. 1 is a schematic diagram illustrating a structure of a polymer in a hole transport material according to an embodiment of the present invention.

| polymer 10, 20 | first metal compound 10a |
| second metal compound 10b | third metal compound 10c |
| QLED device 1 | first electrode 11 |
| hole injection layer 12 | hole transport layer 13 |
| quantum dot layer 14 | electron transport layer 15 |
| second electrode 16 | |

DETAILED DESCRIPTION OF THE EMBODIMENTS

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present invention. Rather, they are merely examples of apparatuses and methods consistent with some aspects of the present invention as detailed in the appended claims.

FIG. 1 is a schematic diagram illustrating a structure of a polymer in a hole transport material according to an embodiment of the present invention.

Referring to FIG. 1, the hole transport material includes: a polymer 10. The polymer 10 is a single nanoparticle including a first metal compound 10a and a second metal compound 10b. The first metal compound 10a and the second metal compound 10b are linked via a covalent bond. Valence band energy levels of the first metal compound 10a and the second metal compound 10b are different.

In some embodiments, the first metal compound 10a and the second metal compound 10b in the polymer 10 can also be linked via a Van der Waals force.

In some embodiments, the first metal compound 10a can be one of NiO, $WO_3$, $V_2O_5$, $CuGaO_2$, $FeS_2$ and $TiS_2$, and the second metal compound 10b can be another one of NiO, $WO_3$, $V_2O_5$, $CuGaO_2$, $FeS_2$ and $TiS_2$. In other words, the polymer may be a dimer such as $NiO/WO_3$, $NiO/V_2O_5$, $NiO/CuGaO_2$, $NiO/FeS_2$, $NiO/TiS_2$, $WO_3/V_{205}$, $WO_3/CuGaO_2$, $WO_3/FeS_2$, $WO_3/TiS_2$, $V_2O_5/CuGaO_2$, $V_2O_5/FeS_2$, $V_2O_5/TiS_2$, $CuGaO_2/FeS_2$, $CuGaO_2/TiS_2$ or $FeS_2/TiS_2$.

In the above embodiment, the polymer 10 is used as the hole transport material. The polymer 10 is a single nanoparticle including at least the first metal compound 10a and the second metal compound 10b. The first metal compound 10a and the second metal compound 10b are linked via a covalent bond or a Van der Waals force. The valence band energy levels of the first metal compound 10a and the second metal compound 10b are different, and a multiple energy level gradient is constructed by using a difference in valence band position of the single nanoparticle. Holes, when transitioning, can first be transitioned to a low energy level, and then to a high energy level after being buffered in the low energy level. Compared with hole transport materials in which holes needs to be directly transitioned to the high energy level, a hole injection barrier can be reduced, a hole injection capability can be improved, and an electron-hole balance can be further improved, so that luminous efficiency and lifetime of QLED devices can be improved.

In addition, compared with directly mixing the first metal compound 10a and the second metal compound 10b, for example, directly mixing NiO and $WO_3$, when an $NiO/WO_3$ dimer is used as a hole transport layer, since NiO and $WO_3$ in the $NiO/WO_3$ dimer are in close contact and are linked via a covalent bond or a Van der Waals force, transport of holes in the $NiO/WO_3$ dimer is more efficient, and transport performance of holes in QLED devices can be further improved.

Energy levels in gradient energy levels can be adjusted by controlling a size of nanoparticles and/or a composition ratio of the first metal compound 10a to the second metal compound 10b. A size of the polymer 10 can be between 1 nm and 100 nm. Since an energy level structure of nanoparticles is determined by their size, defects and other factors, the energy level structure can be achieved by adjusting the size (the size of the polymer 10), and the composition ratio of the first metal compound 10a to the second metal compound 10b.

Figure 2:
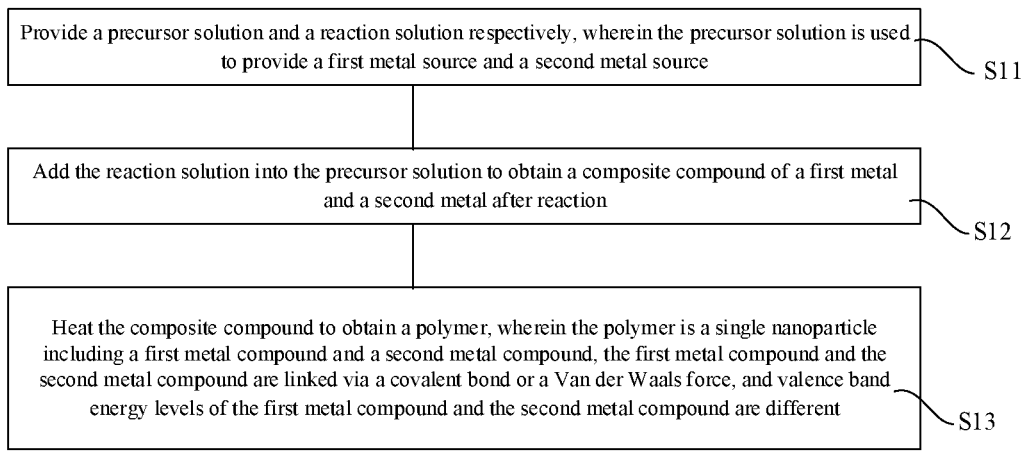
FIG. 2 is a flow chart illustrating a method of producing the polymer in FIG. 1.

For the polymer 10 in the hole transport material in FIG. 1, an embodiment of the present invention provides a producing method. FIG. 2 is a flow chart of the producing method, which includes steps S11 to S13.

At step S11, a precursor solution and a reaction solution are provided respectively. The precursor solution is used to provide a first metal source and a second metal source.

The step S11 can specifically include: weighing 1.82 g of $Ni(NO_3)_2$ and 5.56 g of $W(NO_3)_6$ respectively, dissolving them in 100 mL of deionized water, transferring them into a 500 mL round-bottom flask after dissolving them fully, stirring in an oil bath at 100° C., condensing and refluxing, and reacting for 30 min to obtain the precursor solution. The precursor solution provides a nickel source and a tungsten source for chemical reaction. Then, 19.2 g of $(NH_4)_2CO_3$ is weighed and fully dissolved in 50 mL of deionized water to obtain the reaction solution.

At step S12, the reaction solution is added into the precursor solution to obtain a composite compound of a first metal and a second metal after reaction.

The step S12 can specifically include: adding the reaction solution dropwise into the precursor solution, stirring and reacting for 5 h, where reaction formulas may be:

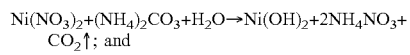

$Ni(NO_3)_2 + (NH_4)_2CO_3 + H_2O \rightarrow Ni(OH)_2 + 2NH_4NO_3 + CO_2\uparrow$; and

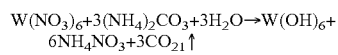

$W(NO_3)_6 + 3(NH_4)_2CO_3 + 3H_2O \rightarrow W(OH)_6 + 6NH_4NO_3 + 3CO_2\uparrow$ thereafter, centrifuging, filtering, washing and drying the reaction solution in an oven at 60° C. to obtain a nickel-tungsten composite hydroxide.

At step S13, the composite compound is heated to obtain the polymer 10. As shown in FIG. 1, the polymer 10 is a single nanoparticle including the first metal compound 10a and the second metal compound 10b. The first metal compound 10a and the second metal compound 10b are linked via a covalent bond or a Van der Waals force. Valence band energy levels of the first metal compound 10a and the second metal compound 10b are different.

The step S13 can specifically include: firing the nickel-tungsten composite hydroxide in a muffle furnace at a firing temperature of 400° C., a heating rate of 5° C./min and a holding time of 4 h to obtain an NiO/WO$_3$ dimer, where a reaction formula can be: W(OH)$_6$+Ni(OH)$_2$→WO$_3$/NiO+ 4H$_2$O.

It can be seen that the NiO/WO$_3$ dimer is synthesized through a hydrothermal reaction method.

The size of nanoparticles, and/or the composition ratio of the first metal compound 10$a$ to the second metal compound 10$b$ can be controlled through experimental conditions to further adjust the energy levels in the gradient energy levels. The size of the polymer 10 can be between 1 nm and 100 nm. Since the energy level structure of nanoparticles is determined by their size, defects and other factors, the energy level structure can be controlled through reaction kinetics and thermodynamics during production, and specifically, be achieved by adjusting the size (the size of the polymer 10), and the composition ratio of the first metal compound 10$a$ to the second metal compound 10$b$. This is because self-doping is an effective way to change physical and chemical properties of semiconductors. During the synthesis of oxide, its size is generally adjusted by changing a reaction temperature and an amount of added reagents. The change in reaction conditions will cause a change in a concentration of oxygen vacancies in a semiconductor. A high concentration of oxygen vacancies can create an energy level below a conduction band of an oxide semiconductor, so that an energy level structure of the entire semiconductor is changed. For sulfides as well, changes in reaction time or temperature during the reaction can also cause a change in a concentration of defects in sulfides (for example, a change in a concentration of Zn vacancies in ZnS), so that the energy level structure is changed.

In some embodiments, composition of the precursor solution includes a salt solution of a first metal element and a second metal element, and composition of the reaction solution includes (NH$_4$)$_2$CO$_3$ or ammonia water.

Taking a dimer that contains NiO and WO$_3$ as an example, a metal source of NiO in the dimer can be sulfate, chloride, etc. of nickel, and a metal source of WO$_3$ can be sulfate, chloride, etc. of tungsten. The reaction solution can include ammonia water, etc.

In some embodiments, a metal source of V$_2$O$_5$ in a dimer can be at least one of sodium vanadate or ammonium metavanadate; and/or a metal source of CuGaO$_2$ can be copper nitrate and gallium nitrate; and/or a metal source of FeS$_2$ can be iron sulfate, iron chloride or iron nitrate; and/or a metal source of TiS$_2$ can be titanium tetrachloride.

Figure 3A:
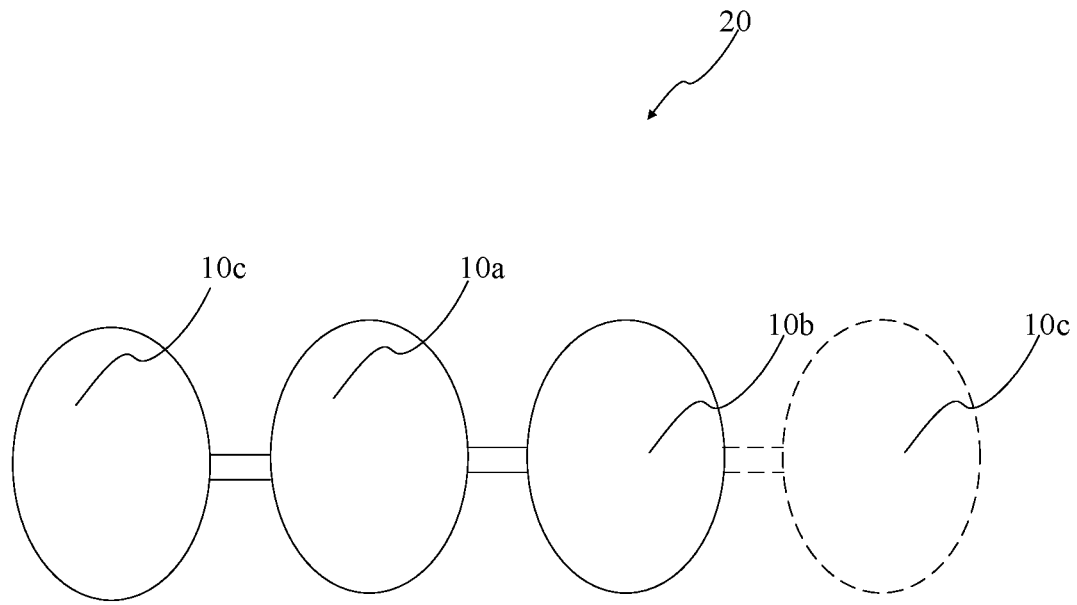
FIG. 3A is a schematic diagram illustrating a structure of a polymer in a hole transport material according to an embodiment of the present invention.

FIG. 3A is a schematic diagram illustrating a structure of a polymer in a hole transport material according to an embodiment of the present invention. Referring to FIG. 3A, a polymer 20 in this embodiment is substantially the same as the polymer 10 in FIG. 1, except that the single nanoparticle further includes a third metal compound 10$c$. The third metal compound 10$c$ and the first metal compound 10$a$ are linked via a covalent bond, or the third metal compound 10$c$ and the second metal compound 10$b$ are linked via a covalent bond. Valence band energy levels of any two of the first metal compound 10$a$, the second metal compound 10$b$ and the third metal compound 10$c$ are different.

Figure 3B:
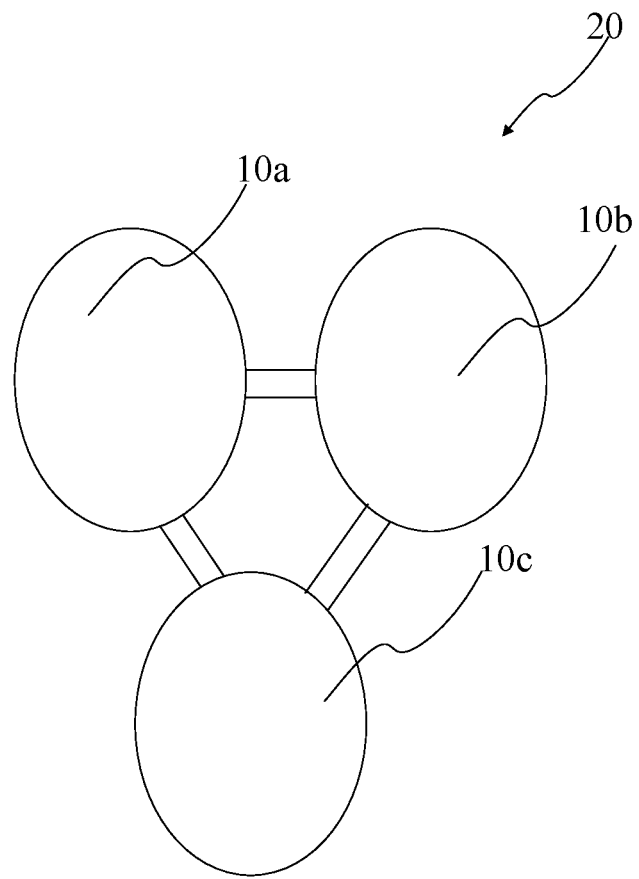
FIG. 3B is a schematic diagram illustrating a structure of a polymer in a hole transport material according to an embodiment of the present invention.

FIG. 3B is a schematic diagram illustrating a structure of a polymer in a hole transport material according to an embodiment of the present invention. Referring to FIG. 3B, the single nanoparticle further includes a third metal compound 10$c$. The third metal compound 10$c$ and the first metal compound 10$a$ are linked via a covalent bond, and the third metal compound 10$c$ and the second metal compound 10$b$ are linked via a covalent bond. Valence band energy levels of any two of the first metal compound 10$a$, the second metal compound 10$b$ and the third metal compound 10$c$ are different.

The valence band energy levels of any two of the first metal compound 10$a$, the second metal compound 10$b$ and the third metal compound 10$c$ are different, which refers to: assuming that a valence band energy level of the first metal compound 10$a$ is A, a valence band energy level of the second metal compound 10$b$ is B, and a valence band energy level of the third metal compound 10$c$ is C, A≠B, A≠C and B≠C.

In some embodiments, any two of the first metal compound 10$a$, the second metal compound 10$b$ and the third metal compound 10$c$ are linked via a covalent bond or a Van der Waals force.

In some embodiments, the third metal compound 10$c$ and the first metal compound 10$a$ are linked via a Van der Waals force, and/or the third metal compound 10$c$ and the second metal compound 10$b$ are linked via a Van der Waals force.

In some embodiments, one of the third metal compound 10$c$ and the first metal compound 10$a$, or the third metal compound 10$c$ and the second metal compound 10$b$ is linked via a covalent bond, and the other is linked via a Van der Waals force.

The third metal compound can be one of NiO, WO$_3$, V$_2$O$_5$, CuGaO$_2$, FeS$_2$ and TiS$_2$, and is different from the first metal compound and the second metal compound. In other words, the polymer 20 is a trimer such as NiO/WO$_3$/V$_2$O$_5$, NiO/WO$_3$/CuGaO$_2$, NiO/WO$_3$/FeS$_2$, NiO/WO$_3$/TiS$_2$, NiO/V$_2$O$_5$/CuGaO$_2$, NiO/V$_2$O$_5$/FeS$_2$, NiO/V$_2$O$_5$/TiS$_2$, NiO/CuGaO$_2$/FeS$_2$, NiO/CuGaO$_2$/TiS$_2$, NiO/FeS$_2$/TiS$_2$, WO$_3$/V$_2$O$_5$/CuGaO$_2$, WO$_3$/V$_2$O$_5$/FeS$_2$, WO$_3$/V$_2$O$_5$/TiS$_2$, V$_2$O$_5$/CuGaO$_2$/FeS$_2$, V$_2$O$_5$/CuGaO$_2$/TiS$_2$ or CuGaO$_2$/FeS$_2$/TiS$_2$.

In some embodiments, the single nanoparticle further includes a fourth metal compound. That is, the polymer can be a tetramer such as NiO/WO$_3$/V$_2$O$_5$/CuGaO$_2$, NiO/WO$_3$/V$_2$O$_5$/FeS$_2$, NiO/WO$_3$/V$_2$O$_5$/TiS$_2$, NiO/WO$_3$/CuGaO$_2$/FeS$_2$, NiO/WO$_3$/CuGaO$_2$/TiS$_2$, NiO/WO$_3$/FeS$_2$/TiS$_2$, NiO/V$_2$O$_5$/CuGaO$_2$/FeS$_2$, NiO/V$_2$O$_5$/CuGaO$_2$/TiS$_2$, NiO/V$_2$O$_5$/FeS$_2$/TiS$_2$, NiO/CuGaO$_2$/FeS$_2$/TiS$_2$, WO$_3$/V$_2$O$_5$/CuGaO$_2$/FeS$_2$, WO$_3$/V$_2$O$_5$/CuGaO$_2$/TiS$_2$, WO$_3$/V$_2$O$_5$/FeS$_2$/TiS$_2$, WO$_3$/CuGaO$_2$/FeS$_2$/TiS$_2$ or V$_2$O$_5$/CuGaO$_2$/FeS$_2$/TiS$_2$.

In some embodiments, the single nanoparticle further includes a fifth metal compound. That is, the polymer can be a pentamer such as NiO/WO$_3$/V$_2$O$_5$/CuGaO$_2$/FeS$_2$, NiO/WO$_3$/V$_2$O$_5$/CuGaO$_2$/TiS$_2$, NiO/WO$_3$/V$_2$O$_5$/FeS$_2$/TiS$_2$, NiO/WO$_3$/CuGaO$_2$/FeS$_2$/TiS$_2$, NiO/V$_2$O$_5$/CuGaO$_2$/FeS$_2$/TiS$_2$ or WO$_3$/V$_2$O$_5$/CuGaO$_2$/FeS$_2$/TiS$_2$.

In some embodiments, the single nanoparticle further includes a sixth metal compound. That is, the polymer can be a hexamer such as NiO/WO$_3$/V$_2$O$_5$/CuGaO$_2$/FeS$_2$/TiS$_2$. The embodiments of the present invention do not limit the number of metal compounds.

The polymers in the above embodiments include metal compounds of different substances. Due to different substances, a large energy level change is caused, and it is easier to construct a multiple energy level gradient by using a difference in valence band position.

In some embodiments, at least two metal compounds included in a single nanoparticle can be the same substance with different energy levels. Energy levels of the same substance can be different by adjusting a size or a producing method of the nanoparticle. For example, when a single nanoparticle includes a first metal compound and a second metal compound, the first metal compound and the second metal compound are NiO with different energy levels, thereby forming a dimer NiO/NiO. For another example, when the single nanoparticle further includes a third metal compound, the first metal compound and the second metal compound are NiO with different energy levels, and the third metal compound is $WO_3$, thereby forming a trimer $NiO/NiO/WO_3$. For another example, when the single nanoparticle further includes a fourth metal compound, the first metal compound and the second metal compound are NiO with different energy levels, and the third metal compound and the fourth metal compound are $WO_3$ with different energy levels, thereby forming a tetramer $NiO/NiO/WO_3/WO_3$. For another example, when the single nanoparticle further includes a fifth metal compound, the first metal compound and the second metal compound are NiO with different energy levels, and the third metal compound, the fourth metal compound, and the fifth metal compound are $WO_3$ with different energy levels, thereby forming a pentamer $NiO/NiO/WO_3/WO_3/WO_3$. For another example, when the single nanoparticle further includes a sixth metal compound, the first metal compound and the second metal compound are NiO with different energy levels, the third metal compound and the fourth metal compound are $WO_3$ with different energy levels, and the fifth metal compound and the sixth metal compound are $V_2O_5$ with different energy levels, thereby forming a hexamer $NiO/NiO/WO_3/WO_3/V_2O_5/V_2O_5$. In the above embodiments, the energy levels of all metal compounds included in the single nanoparticle can be different from each other.

The multiple energy level gradient of the polymer 20 in the above embodiments can further reduce a hole injection barrier and improve a hole injection capability, so that luminous efficiency and lifetime of QLED devices can be improved.

Correspondingly, a method for producing the polymer 20 is substantially the same as the producing method in FIG. 2, except that, in the step S11, the precursor solution provided is further used to provide a third metal source.

A size of the nanoparticle, and/or a composition ratio of the first metal compound 10a to the second metal compound 10b to the third metal compound 10c can be controlled through experimental conditions, and energy levels in the gradient energy levels can be further adjusted.

Figure 4:
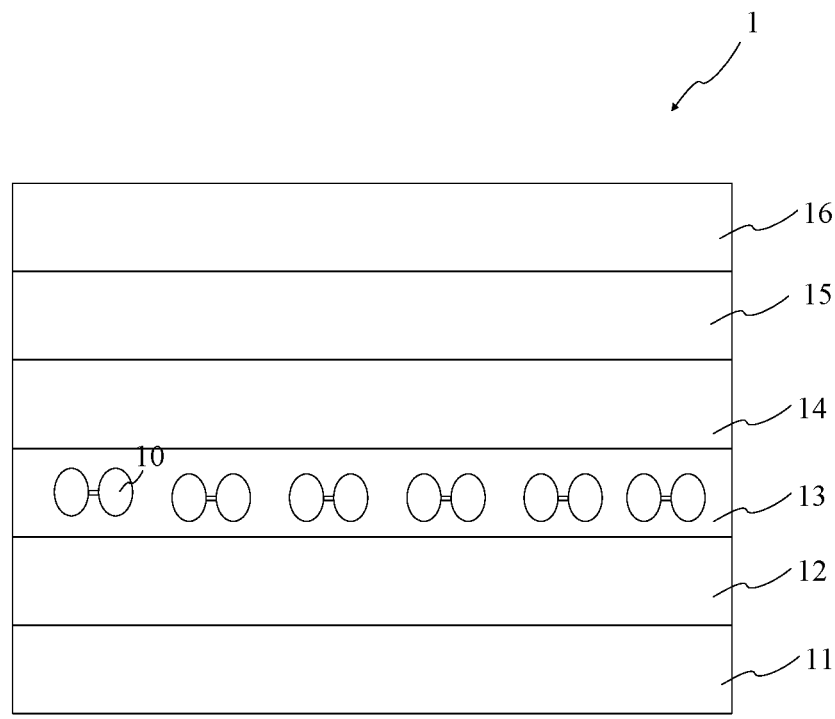
FIG. 4 is a schematic diagram illustrating a structure of a QLED device according to an embodiment of the present invention.

FIG. 4 is a schematic diagram illustrating a structure of a QLED device according to an embodiment of the present invention. Referring to FIG. 4, a QLED device 1 includes a first electrode 11, a hole injection layer 12, a hole transport layer 13, a quantum dot layer 14, an electron transport layer 15 and a second electrode 16 in sequence.

In some embodiments, the QLED device 1 can have a bottom light emitting structure. At this time, the first electrode 11 can be an anode, specifically, a light transmitting anode, and is made of a material such as Indium Tin Oxide (ITO). The second electrode 16 can be a cathode having a light reflecting function, and is made of a material such as aluminum.

In other embodiments, the QLED device 1 can have a top light emitting structure. At this time, the first electrode 11 can be an anode, specifically, a light reflecting anode, and is made of a material such as silver. The second electrode 16 can be a cathode having partially light transmitting and partially light reflecting functions, and is made of a material such as magnesium and aluminum.

The hole injection layer 12 can be a PEDOT:PSS film. Poly(3,4-ethylenedioxythiophene) (PEDOT) and poly(sodium-p-styrenesulfonate) (PSS) are mixed in a certain ratio and dissolved in water to form a uniformly dispersed PEDOT:PSS solution. The PEDOT:PSS film made of the PEDOT:PSS solution has good flexibility, stability, and high transparency in a visible light range. Moreover, a work function of PEDOT:PSS is generally 5.0 to 5.1 eV, which is very conducive to hole injection.

The hole transport layer 13 can include either of the polymers 10 and 20.

A thickness of the hole transport layer 13 can range from 1 nm to 100 nm.

The quantum dot layer 14 can include a group II-VI core-shell semiconductor material, a group IV-VI core-shell semiconductor material, a group semiconductor material, and a perovskite light emitting material. Specifically, the group II-VI core-shell semiconductor material includes, but is not limited to, CdSe/ZnS, CdZnS/ZnS, and $Cd_xZn_{1-x}Se_yS_{1-y}/ZnS$. The group IV-VI core-shell semiconductor material includes, but is not limited to, PbSe, PbS, PbSe/CdS, and PbSe/ZnS. The group semiconductor material includes, but is not limited to, Cu—In—S. The perovskite light emitting material includes, but is not limited to, $MAPbX_3$ and $CsPbX_3$.

The electron transport layer 15 can include at least one of ZnO nanoparticles or ZnMgO nanoparticles.

Figure 5:
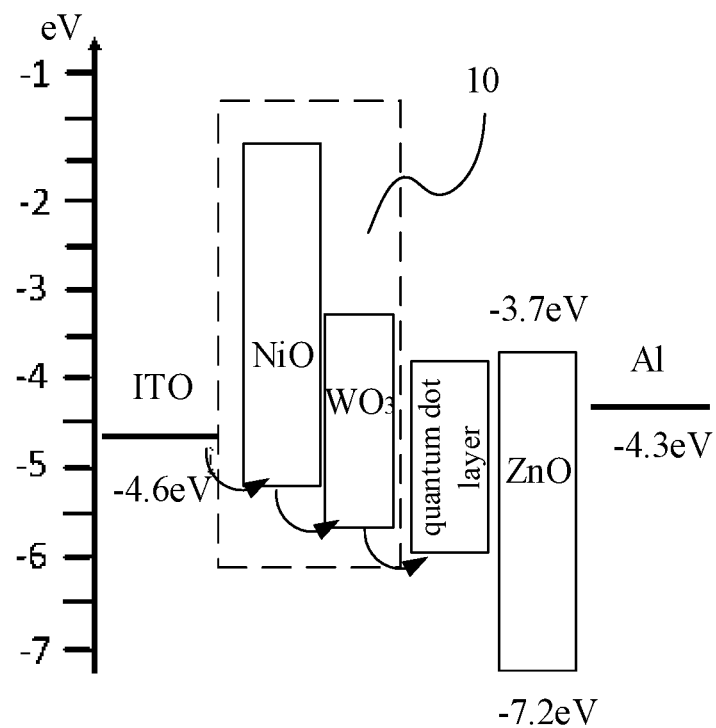
FIG. 5 is a schematic diagram illustrating an energy level structure of a QLED device.

FIG. 5 is a schematic diagram illustrating an energy level structure of a QLED device.

Referring to FIG. 5, an band gap $E_g$ of $WO_3$ is 2.7 eV, a conduction band energy level $E_{CB}$ is 0.74 eV, and a valence band energy level $E_{VB}$ is 3.44 eV. An band gap $E_g$ of NiO is 3.5 eV, a conduction band energy level $E_{CB}$ is −0.5 eV, and a valence band energy level $E_{VB}$ is 3 eV. In the QLED device 1, different valence band energy levels of $NiO/WO_3$ dimer 10 construct a multiple energy level gradient. When holes of the first electrode 11 made of ITO are transitioning, they can first be transitioned to a low energy level of the $NiO/WO_3$ dimer 10, and then to a high energy level of the $NiO/WO_3$ dimer 10 after being buffered in the low energy level. Compared with hole transport materials in which holed needs to be directly transitioned to the high energy level, the $NiO/WO_3$ dimer 10 can reduce a hole injection barrier, improve a hole injection capability, and further improve an electron-hole balance, so that luminous efficiency and lifetime of the QLED device 1 can be improved.

Compared with a hole transport layer of NiO that is bonded to a hole transport layer of $WO_3$, a QLED device produced by a dimer hole transport layer is easier, and can simplify a structure of the QLED device. In addition, effects on performance of the QLED device caused by interface factors of the two hole transport layers can be eliminated.

Figure 6:
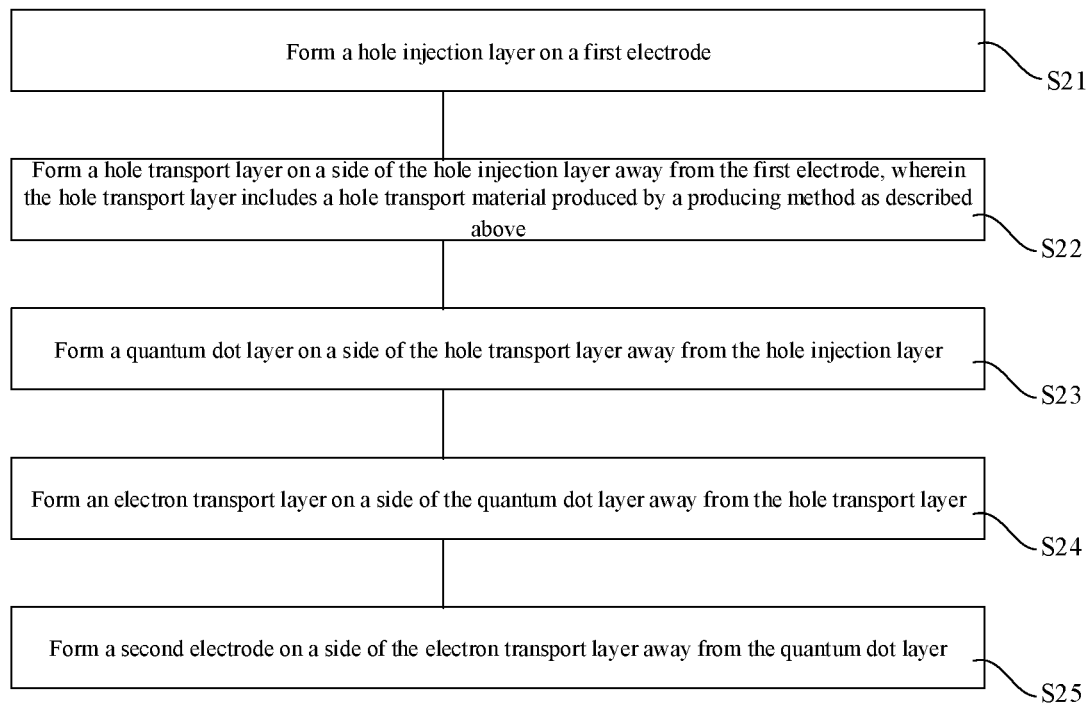
FIG. 6 is a flow chart illustrating a method of producing the QLED device in FIG. 4.

For the QLED device 1 in FIG. 4, an embodiment of the present invention provides a producing method. FIG. 6 is a flow chart illustrating the producing method, which includes steps S21 to S25.

At step S21, as shown in FIG. 4, a hole injection layer 12 is formed on a first electrode 11.

In some embodiments, the QLED device 1 can have a bottom light emitting structure. At this time, the first electrode 11 may be an anode, specifically, a light transmitting anode, and is made of a material such as indium tin oxide (ITO). In other embodiments, the QLED device 1 can have a top light emitting structure. At this time, the first electrode 11 can be a light reflecting anode, and is made of a material such as silver.

In the step S21, the hole injection layer 12 can be formed by spin-coating a PEDOT:PSS aqueous solution or ink-jet printing a PEDOT:PSS film.

At step S22, as shown in FIG. 4, a hole transport layer 13 is formed on a side of the hole injection layer 12 away from the first electrode 11. The hole transport layer 13 includes a hole transport material produced by any of the above-mentioned producing methods.

The hole transport layer 13 can include either of the polymers 10 and 20.

In the step S22, during the formation of the hole transport layer 13, a manner of coating a hole transport material solution, or ink-jet printing a hole transport material ink, or electro-jet printing the hole transport material ink can be used. Coating the hole transport material solution includes spin coating, blade coating, spray coating or other manners.

Before the spin coating, the hole transport material produced by the above-mentioned producing methods can be dispersed in a volatile dispersant to form a solution or colloid. The volatile dispersant is a solvent such as water or ethanol.

At step S23, as shown in FIG. 4, a quantum dot layer 14 is formed on a side of the hole transport layer 13 away from the hole injection layer 12.

The quantum dot layer 14 can include a group II-VI core-shell semiconductor material, a group IV-VI core-shell semiconductor material, a group semiconductor material, and a perovskite light emitting material.

In the step S23, spin-coating a quantum dot solution or ink-jet printing a quantum dot colloid can be used.

At step S24, as shown in FIG. 4, an electron transport layer 15 is formed on a side of the quantum dot layer 14 away from the hole transport layer 13.

The electron transport layer 15 can include at least one of ZnO nanoparticles or ZnMgO nanoparticles.

In the step S24, spin coating a ZnO/ZnMgO nanoparticle solution or ink-jet printing a ZnO/ZnMgO nanoparticle colloid can be used.

At step S25, as shown in FIG. 4, a second electrode 16 is formed on a side of the electron transport layer 15 away from the quantum dot layer 14.

In some embodiments, the QLED device 1 can have a bottom light emitting structure. At this time, the second electrode 16 can be a cathode having a light reflecting function, and is made of a material such as aluminum.

In other embodiments, the QLED device 1 can have a top light emitting structure. At this time, the second electrode 16 can be a cathode having partially light transmitting and partially light reflecting functions, and is made of a material such as magnesium and aluminum.

In the step S25, evaporating a second electrode material layer or ink-jet printing the second electrode material layer can be used.

Based on the QLED device 1, an embodiment of the present invention further provides a display device including the QLED device 1. The display device can be any product or component having a display function, such as electronic paper, a mobile phone, a tablet computer, a television, a notebook computer, a digital photo frame or a navigator.

It should be pointed out that in the drawings, sizes of layers and regions may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

In the present invention, terms "first" and "second" are used only for descriptive purposes, and cannot be understood as indicating or implying relative importance.

Other embodiments of the present invention will be readily apparent to those skilled in the art after considering the specification and practicing the contents disclosed herein. The present invention is intended to cover any variations, uses, or adaptations of the present invention, which follow the general principle of the present invention and include common knowledge or conventional technical means in the art that are not disclosed in the present invention. The specification and examples are to be regarded as illustrative only. The true scope and spirit of the present invention are pointed out by the following claims.

It is to be understood that the present invention is not limited to the precise structures that have described and shown in the drawings, and various modifications and changes can be made without departing from the scope thereof. The scope of the invention is to be limited only by the appended claims.

The invention claimed is:

1. A hole transport material, comprising: a polymer, wherein the polymer is a single nanoparticle comprising at least a first metal compound and a second metal compound, the first metal compound and the second metal compound are linked via a covalent bond or a Van der Waals force, and valence band energy levels of the first metal compound and the second metal compound are different;
   wherein the single nanoparticle further comprises a third metal compound, the third metal compound and the first metal compound are linked via a covalent bond or a Van der Waals force, and/or the third metal compound and the second metal compound are linked via a covalent bond or a Van der Waals force, valence band energy levels of any two of the first metal compound, the second metal compound and the third metal compound are different.

2. The hole transport material according to claim 1, wherein the first metal compound is one of NiO, $WO_3$, $V_2O_5$, $CuGaO_2$, $FeS_2$ and $TiS_2$, and the second metal compound is another one of NiO, $WO_3$, $V_2O_5$, $CuGaO_2$, $FeS_2$ and $TiS_2$.

3. The hole transport material according to claim 1, wherein the third metal compound is one of NiO, $WO_3$, $V_2O_5$, $CuGaO_2$, $FeS_2$ and $TiS_2$.

4. The hole transport material according to claim 1, wherein the third metal compound is one of NiO, $WO_3$, $V_2O_5$, $CuGaO_2$, $FeS_2$ and $TiS_2$, and is different from the first metal compound and the second metal compound.

5. A method of producing a hole transport material, comprising:
   providing a precursor solution and a reaction solution respectively, wherein the precursor solution is used to provide at least a first metal source and a second metal source;
   adding the reaction solution into the precursor solution to obtain a composite compound of a first metal and a second metal after reaction; and
   heating the composite compound to obtain a polymer, wherein the polymer is a single nanoparticle comprising at least a first metal compound and a second metal compound, the first metal compound and the second metal compound are linked via a covalent bond or a Van der Waals force, and valence band energy levels of the first metal compound and the second metal compound are different;

wherein composition of the precursor solution comprises a salt solution of a first metal element and a second metal element, and composition of the reaction solution comprises $(NH_4)_2CO_3$ or ammonia water.

6. A method of producing a quantum dot light emitting diode QLED device, comprising:

forming a hole injection layer on a first electrode;

forming a hole transport layer on a side of the hole injection layer away from the first electrode, wherein the hole transport layer comprises a hole transport material produced with a producing method according to claim 5;

forming a quantum dot layer on a side of the hole transport layer away from the hole injection layer;

forming an electron transport layer on a side of the quantum dot layer away from the hole transport layer; and forming a second electrode on a side of the electron transport layer away from the quantum dot layer.

7. The QLED device according to claim 6, wherein, during the forming of the hole transport layer, a manner of coating a hole transport material solution, ink-jet printing a hole transport material ink, or electro-jet printing the hole transport material ink is used.

8. The method of producing the hole transport material according to claim 5, wherein when producing a $NiO/WO_3$ dimer, in the $NiO/WO_3$ dimer, a metal element used for NiO is from at least one of nickel sulfate or nickel chloride, and a metal element used for $WO_3$ is from at least one of tungsten sulfate or tungsten chloride.

9. The method of producing the hole transport material according to claim 5, wherein, when the produced dimer comprises $V_2O_5$, a metal element used for $V_2O_5$ is from at least one of sodium vanadate or ammonium metavanadate;

when the produced dimer comprises $CuGaO_2$, metal elements used for $CuGaO_2$ are from copper nitrate and gallium nitrate;

when the produced dimer comprises $FeS_2$, a metal element used for $FeS_2$ is from at least one of iron sulfate, iron chloride or iron nitrate;

when the produced dimer comprises $TiS_2$, a metal element used for $TiS_2$ is from titanium tetrachloride.

10. A quantum dot light emitting diode QLED device, comprising: a hole transport layer made of a hole transport material comprising: a polymer, wherein the polymer is a single nanoparticle comprising at least a first metal compound and a second metal compound, the first metal compound and the second metal compound are linked via a covalent bond or a Van der Waals force, and valence band energy levels of the first metal compound and the second metal compound are different;

wherein the single nanoparticle further comprises a third metal compound, the third metal compound and the first metal compound are linked via a covalent bond or a Van der Waals force, and/or the third metal compound and the second metal compound are linked via a covalent bond or a Van der Waals force, valence band energy levels of any two of the first metal compound, the second metal compound and the third metal compound are different.

11. The QLED device according to claim 10, further comprising: a first electrode, a hole injection layer, a quantum dot layer, an electron transport layer, and a second electrode.

12. The QLED device according to claim 11, wherein the hole injection layer is a PEDOT: PSS film, and/or the electron transport layer comprises at least one of ZnO nanoparticles or ZnMgO nanoparticles.

13. The QLED device according to claim 12, wherein a work function of the PEDOT: PSS film is in a range from 5.0 eV to 5.1 eV.

14. The QLED device according to claim 10, wherein a thickness of the hole transport layer is in a range from 1 nm to 100 nm.

15. A display device, comprising: a QLED device according to claim 10.

* * * * *